United States Patent [19]

Asai

[11] Patent Number: 5,424,721
[45] Date of Patent: Jun. 13, 1995

[54] METHOD AND ARRANGEMENT FOR ADVISING WHEN RADIO PAGER BATTERY REQUIRES REPLACEMENT

[75] Inventor: Takayuki Asai, Tokyo, Japan

[73] Assignee: NEC Corporation, Tokyo, Japan

[21] Appl. No.: 859,971

[22] Filed: Mar. 30, 1992

[30] Foreign Application Priority Data

Mar. 30, 1991 [JP] Japan .................. 3-93374

[51] Int. Cl.$^6$ ............................................. G08B 21/00
[52] U.S. Cl. .................... 340/636; 340/309.15; 340/825.44
[58] Field of Search ............ 340/636, 632, 825.44, 340/309.15; 455/38.3; 320/48

[56] References Cited

U.S. PATENT DOCUMENTS

| | | | |
|---|---|---|---|
| 4,345,603 | 8/1982 | Schulman | 128/419 PT |
| 4,380,726 | 4/1983 | Sado et al. | 320/48 |
| 4,471,492 | 9/1984 | Mann et al. | 455/73 |
| 4,755,816 | 7/1988 | Deluca | 340/825.44 |
| 4,876,632 | 10/1989 | Osterhout et al. | 362/183 |
| 5,140,310 | 8/1992 | DeLuca et al. | 340/636 |

FOREIGN PATENT DOCUMENTS

| | | |
|---|---|---|
| 1483782 | 8/1977 | United Kingdom . |
| 2239747 | 7/1991 | United Kingdom . |

*Primary Examiner*—Jeffery A. Hofsass
*Attorney, Agent, or Firm*—Sughrue, Mion, Zinn, Macpeak & Seas

[57] ABSTRACT

In order to obviate the tendency for batteries to be changed at an overly early timing, the battery voltage is monitored and a first alarm is issued when the battery voltage drops below a predetermined level. The issuance of the first alarm sets a timer which times a predetermined period and issues a second alarm upon the expiration thereof. The length of the predetermined period may be adjusted by the user and the time from the issuance of the first alarm may be shown on a display upon demand.

1 Claim, 3 Drawing Sheets

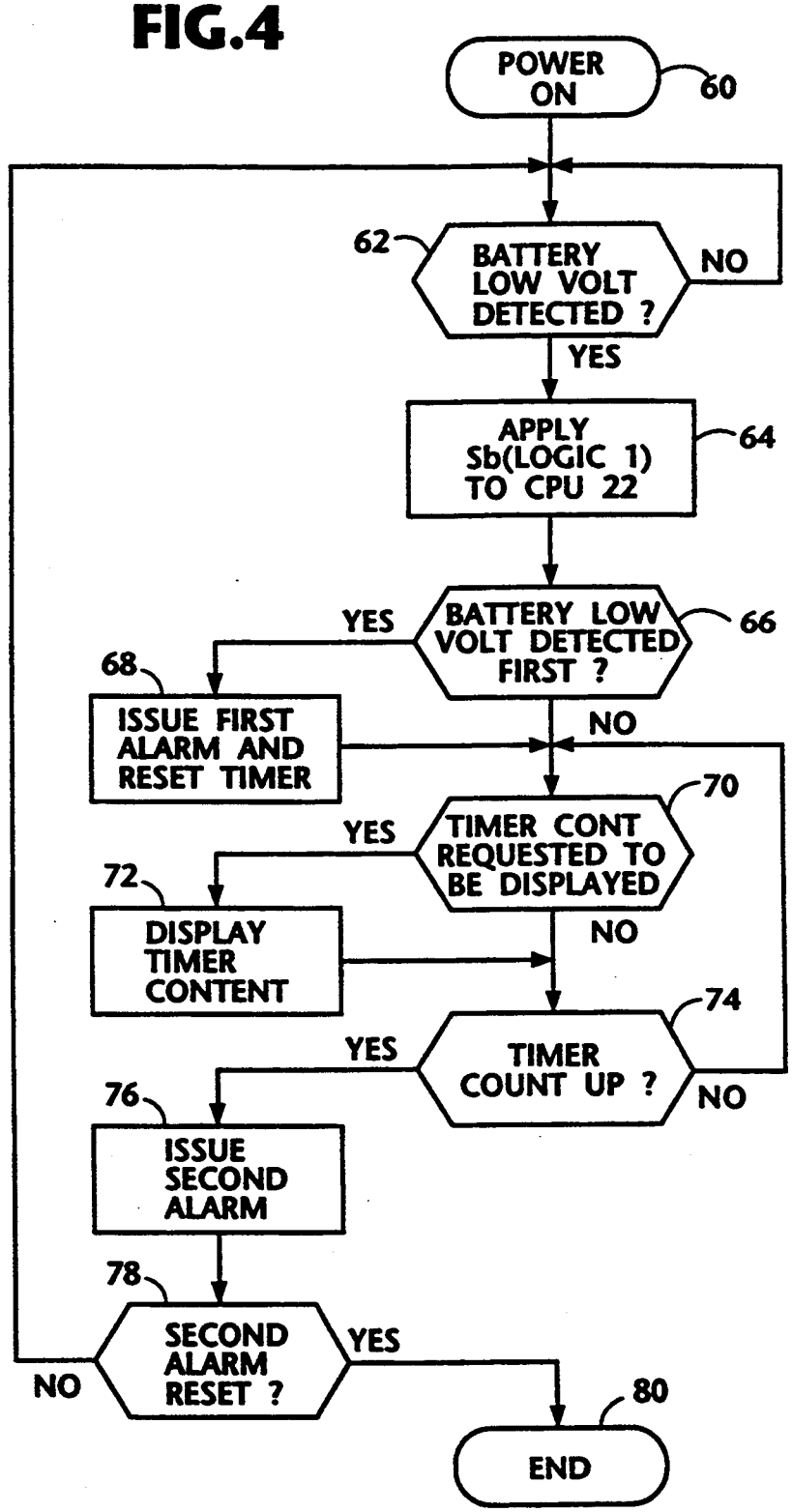

METHOD AND ARRANGEMENT FOR ADVISING WHEN RADIO PAGER BATTERY REQUIRES REPLACEMENT

BACKGROUND OF THE INVENTION

1. Field of the Invention

The present invention relates to improvements in a battery-operated radio pager, and more specifically to a method and arrangement which enables the need for battery replacement to be indicated in a manner which obviates wastefull overly early replacement.

2. Description of the Prior Art

A radio pager which is equipped with a display function has proven very popular in that a large amount of data can be acquired at one calling as compared with an older style pager which alerts a person to call a single predetermined phone number merely by means of sound and/or flashing light.

In order to prevent the battery-operated pager from being rendered inoperative due to loss of battery voltage, it is a common practice to provide a battery voltage detector and alarm generating circuitry operatively coupled thereto.

Currently, it is common to change the battery of the pager as soon as the voltage produced by the same drops to a predetermined level irrespective of the fact that the battery can still continue to operate the pager for some time. In other words, the predetermined level is set so as to be on the safe side and such that the pager will still continue to operate on the current battery. This avoids the problem that under some circumstances it may not be possible to obtain a new battery quickly enough following the low voltage alert.

That is to say, it is practically impossible for a subscriber to predict the exact time the battery currently in use will fail and become useless due to a further voltage drop. It is therefore a usual practice for a subscriber to replace the old battery with a new one as soon as practical after the battery power drop is detected by the detector.

However, in view of very large number of pager subscribers currently in use around the world, this overly early battery replacement amounts to a vast waste of resources and energy and is contrary to the current trend of protecting global ecology.

SUMMARY OF THE INVENTION

During the development of the present invention the use of a second lower voltage level detection was investigated. However, it was discovered that in some cases the battery would deteriorate in such a manner that a warning indicating that the second lower voltage had been reached, could not be generated.

It is an object of the present invention to provide an arrangement by which a pager subscriber is effectively alerted to the need for battery replacement and which reduces the tendancy for the above mentioned overly early battery changing to occur.

Another object of the present invention is to provide a method by which a pager subscriber is effectively alerted to the need for a timely battery replacement.

In brief, the above objects are achieved by an arrangement wherein the battery voltage is monitored and a first alarm is issued when the battery voltage drops below a predetermined level. A timer is set in response to the issuance of the first alarm. The timer times a predetermined period and issues a second alarm upon the expiration thereof. The length of the predetermined period may be adjusted by the user and the time from the issuance of the first alarm may be shown on a display upon demand.

More specifically a first aspect of the present invention comes in a method of operating a battery powered radio pager which features the steps of: comparing the voltage level of a battery with a predetermined voltage level and detecting the battery voltage being equal to or falling below the predetermined voltage level; detecting the initial occurrence of the battery voltage falling below the predetermined voltage and issuing a first alarm signal; and generating a second alarm signal a predetermined time period after the issuance of the first alarm signal.

A second aspect of the present invention comes in the form of a portable battery operated radio pager which features: means for comparing the voltage level of a battery with a predetermined voltage level and for detecting the battery voltage falling below the predetermined voltage level; means responsive to the initial detection of the voltage falling below the predetermined voltage level for issuing a first alarm signal; and timer means responsive to the issuance of the first alarm for generating a second alarm signal a predetermined time period after the issuance of the first alarm signal.

BRIEF DESCRIPTION OF THE DRAWINGS

The features and advantages of the present invention will become more clearly appreciated from the following description taken in conjunction with the accompanying drawings in which like elements are denoted by like reference numerals and in which:

FIG. 4 shows a flowchart depicting the steps which characterizes the operation of the present invention.

DETAILED DESCRIPTION OF THE PREFERRED EMBODIMENTS

Figure 1:
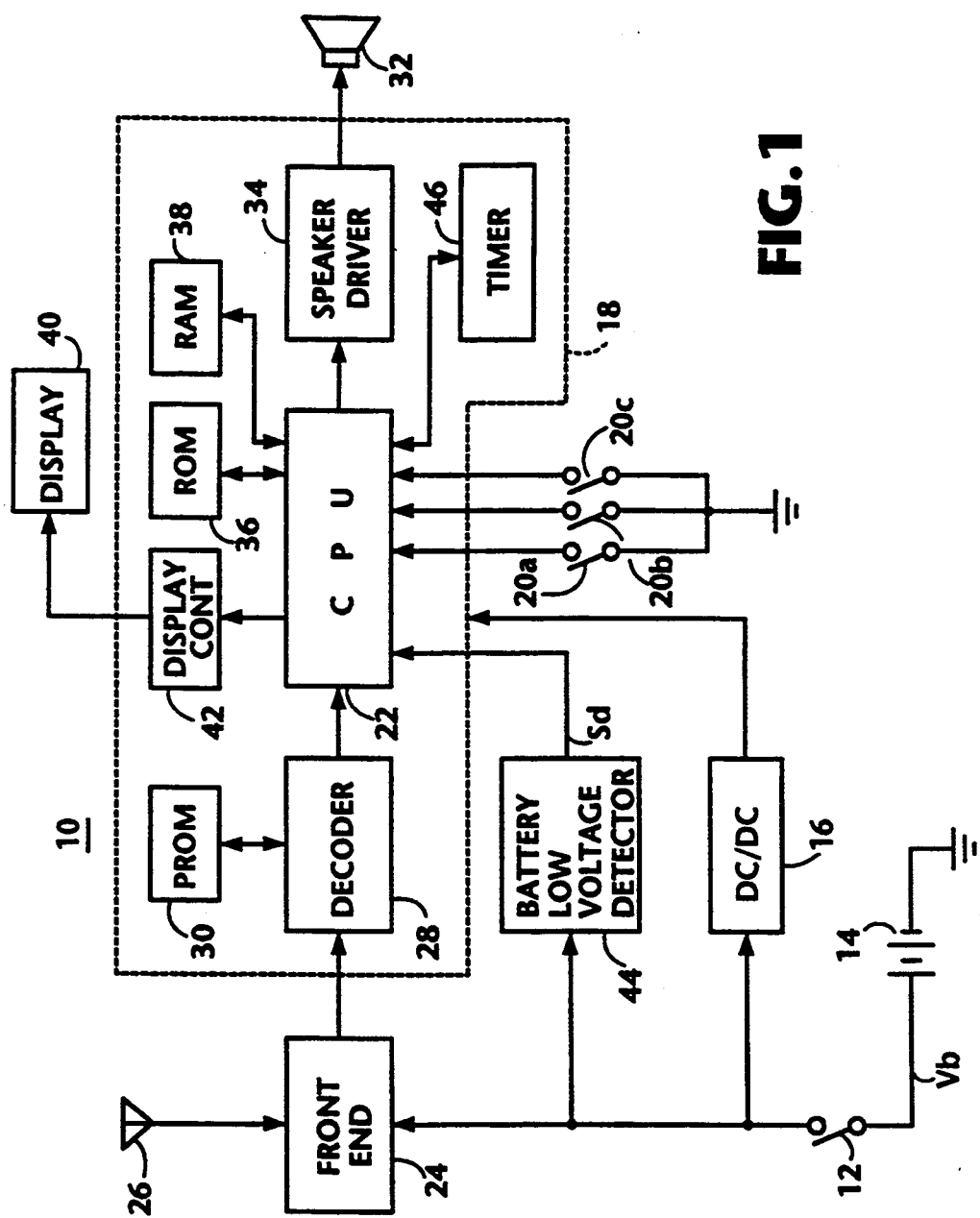
FIG. 1 is a block diagram showing the overall arrangement of a radio pager to which the present invention is applied.

FIG. 1 is a block diagram showing a hardware arrangement of a radio pager 10 to which the present invention is applied. In this arrangement, when a power switch 12 is set to the ON position, a battery voltage Vb is supplied from a battery 14 to a DC/DC converter 16 which is provided for elevating the battery voltage Vb to a potential suitable for operating the circuits included in the blocks enclosed within the dotted line and denoted by the numeral 18. Three multi-function switches 20a–20c are provided between a CPU (Central Processing Unit) 22 and a reference voltage.

A front end 24 is provided for amplifying and demodulating a code-modulated carrier wave received by an antenna 26. The front end 24 is conventional in construction and arrangement and comprises a high frequency amplifier, a frequency converter, an IF amplifier and a discriminator (not illustrated in FIG. 1). The output out the front end 24 is applied to a decoder 28 which searches for an ID (Identification) address code prestored in a PROM (Programmable Read Only Memory) 30. In the event that the ID address code coincides with a subscriber's unique code, the decoder 28 informs the CPU 22 of the coincidence and simultaneously energizes a speaker 32 by way of a speaker driver 34. Although not shown in FIG. 1, a light source such as an LED (Light Emitting Diode) may be installed to provide a visible signal in parallel with the audible signal from the speaker 32.

The CPU 22 controls the overall operations of the pager 10 using a program which is previously stored in a ROM 36.

In the event that the ID address code is followed by a message when the decoder 28 establishes the above-mentioned coincidence, the CPU 22 stores the message in a RAM (Random Access Memory) 38 and simultaneously shows same on a display 40 using a display controller 42 in a manner known in the art.

The FIG. 1 arrangement further includes a low battery voltage detector 44 and a timer 46. Both of these elements are directly concerned with the present invention and will be discussed in detail later.

Figure 2:
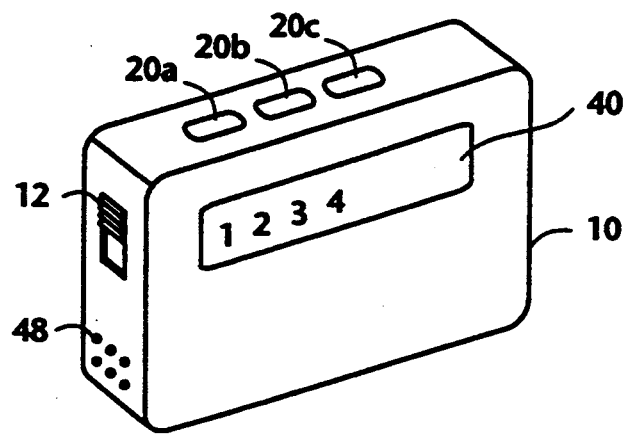
FIG. 2 is a perspective view showing an example of the type of pager to which the present invention is applicable.

FIG. 2 is a schematic perspective view of the type of radio pager 10 to which the invention is applicable. Of course this illustration shows only one example as will be readily understood. As shown, the pager 10 in this instance is equipped with the display 40 (FIG. 1) on the front face, the power switch 12 on a side edge, and the above mentioned three multi-function switches 20a-20c along the top edge. A plurality of small apertures 48 are provided to facilitate the emission of an audible signal from the speaker 32 (not shown in FIG. 2).

Figure 3:
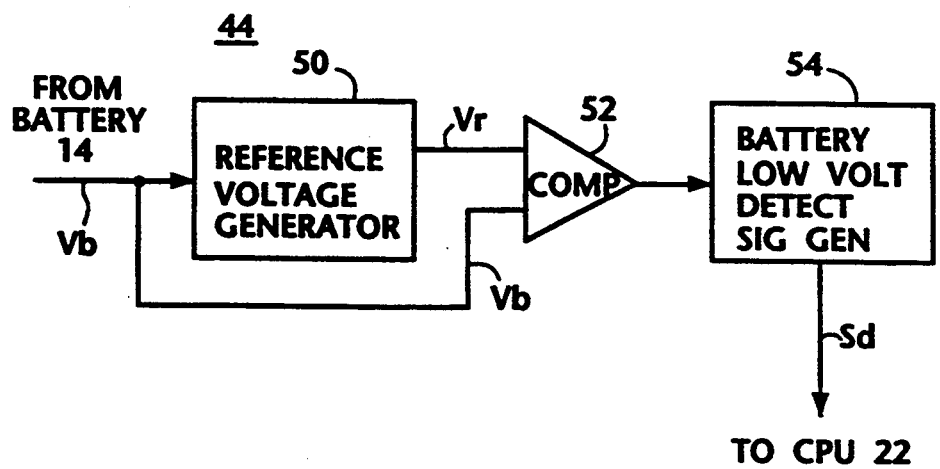
FIG. 3 is a block diagram showing details of the low battery detection section illustrated in FIG. 1.

FIG. 3 is a block diagram showing an arrangement of one example of the low voltage detector 44 (FIG. 1). As shown in this figure, a reference voltage generator 50 is coupled to receive the battery voltage Vb and produces a reference voltage Vr which is previously determined during the circuit design of the pager 10. A comparator 52 is supplied with the two voltages Vr and Vb, and continues to issue a logic "0" (for example) while Vb equals or is larger than Vr. In the event that Vb falls below Vr the output of the comparator 52 assumes a logic "1" level. A battery low voltage detect signal generator 54 responds to the output of the comparator 52 by outputting a signal Sd which exhibits a logic "0" level while receiving a logic "0" from the comparator 52. However, upon the output of the comparator going to a logic "1" level the signal Sd correspondingly become logic "1" in response thereto.

When the signal Sd assumes the logic "1" level for the first time, the CPU resets the timer 46 and then sets the same counting.

The operation of the present invention will now be given in detail with reference to the flowchart shown in FIG. 14.

Following the pager 10 being switched on (step 60), the pager 10 enters a waiting loop (step 62) until a predetermined low battery voltage is detected by the detector 44 (step 62). Upon the battery voltage Vb being detected as having fallen below the reference voltage Vr, the pager control proceeds to step 64 wherein the signal Sd assuming a logic "1" is applied to the CPU 22.

Thereafter, the pager control goes to step 66 to ckeck to see if the instant low battery voltage is the first to be detected. In the event of a positive outcome (viz., the instant detection in the first) the pager control goes to step 68 wherein a first alarm is issued and, simultaneously the timer 46 is reset (viz., the timer is started counting from zero). Following this, a check is made, in step 70, to see if the switch 20a (for example) is being pressed to cause instant count to be displayed on the display 40. If the answer is affirmative, instructions for the counted time to be displayed are issued at step 72 for a predetermined time interval. Following this, the pager control proceeds to step 74. In the event of a negative indication at step 70, the program goes directly to step 74.

In step 74 a check is made to see if the timer 46 has reached the predetermined value or not. In the event of a positive outcome (viz., the count has been reached) the pager control proceeds to step 76 wherein a second alarm is issued. Otherwise, the routine enters a loop (steps 70, 72 and 74).

With the present invention, while a suitable time period is set for the timer during manufacture, it is possible for the user to adjust the time period to his/her taste. This time adjustment is achieved by selectively operating a selected one of the three switches 20a, 20b and 20c. For example, if the user receives a large number of calls, or the calls are apt to be of a very urgent nature, it may be wise to shorten the time at which the second alarm is issued, while in the case of very infrequent calls, the time may possibly be increased somewhat.

It will be understood that the above disclosure is representative of only one possible embodiment of the present invention and that the concept on which the invention is based is not specifically limited thereto.

What is claimed is:

1. A portable battery operated radio pager, comprising:
    means for comparing the voltage level of a battery with a predetermined voltage level and for detecting when the battery voltage falls below the predetermined voltage level;
    means responsive to an initial detection of the voltage falling below the predetermined voltage level for issuing a first alarm signal;
    timer means responsive to the issuance of the first alarm for generating a second alarm signal at a predetermined time period after the issuance of the first alarm signal, wherein said timer means counts up from the issuance of the first alarm signal and issues the second alarm signal upon a predetermined count being reached;
    display means; and
    control means operatively connected to said display means and said timer means, said control means prior to the generation of the second alarm signal, being responsive to a manually generated signal for inducing the count of the timer means to be displayed on the display.

* * * * *

UNITED STATES PATENT AND TRADEMARK OFFICE
CERTIFICATE OF CORRECTION

PATENT NO. : 5,424,721
DATED : June 13, 1995
INVENTOR(S) : Takayuki Asai

It is certified that error appears in the above-indentified patent and that said Letters Patent is hereby corrected as shown below:

Col. 3, line 53, delete "14", insert -- 4 --

Signed and Sealed this

Seventeenth Day of October, 1995

Attest:

BRUCE LEHMAN

*Attesting Officer*     *Commissioner of Patents and Trademarks*